United States Patent [19]

Yuyama et al.

[11] 4,408,135
[45] Oct. 4, 1983

[54] MULTI-LEVEL SIGNAL GENERATING CIRCUIT

[75] Inventors: Toshio Yuyama, Kawasaki; Ryuzo Shiraki; Seizi Watanabe, both of Tokyo, all of Japan

[73] Assignee: Tokyo Shibaura Denki Kabushiki Kaisha, Japan

[21] Appl. No.: 216,818

[22] Filed: Dec. 16, 1980

[30] Foreign Application Priority Data

Dec. 26, 1979 [JP] Japan .................. 54-169755
Dec. 26, 1979 [JP] Japan .................. 54-169756

[51] Int. Cl.³ .................. H03K 19/094; H03K 17/687
[52] U.S. Cl. .................. 307/474; 307/451; 307/585
[58] Field of Search .............. 307/473, 474, 451, 585, 307/270

[56] References Cited

U.S. PATENT DOCUMENTS

| | | | |
|---|---|---|---|
| 3,795,827 | 3/1974 | Greger | 307/279 |
| 3,896,430 | 7/1975 | Hatsukano | 307/473 X |
| 3,903,518 | 9/1975 | Hatsukano | 307/313 |
| 4,027,305 | 5/1977 | Kishimoto | 307/473 |
| 4,038,564 | 7/1977 | Hakata | 307/474 |
| 4,121,203 | 10/1978 | Edwards et al. | 307/270 |

FOREIGN PATENT DOCUMENTS

| | | |
|---|---|---|
| 2404956 | 11/1975 | Fed. Rep. of Germany . |
| 50-67036 | 6/1975 | Japan . |
| 5222894 | 8/1975 | Japan . |
| 50-111951 | 9/1975 | Japan . |

Primary Examiner—John S. Heyman
Attorney, Agent, or Firm—Finnegan, Henderson, Farabow, Garrett & Dunner

[57] ABSTRACT

A multi-level signal generating circuit is disclosed which comprises: a first CMOS inverter for inverting an input signal to produce a first output signal having high and low voltage levels; a second CMOS inverter for inverting the input signal to produce a second output signal having high and low voltage levels; at least one of the high and low voltage levels of the second output signals being different from said high and low voltage of said first output signal; and switching circuit operative to drive selectively said first CMOS inverter or said second CMOS inverter in response to a level of a control signal.

2 Claims, 31 Drawing Figures

FIG. 1
PRIOR ART

FIG. 2A INPUT

FIG. 2D OUTPUT

FIG. 3
PRIOR ART

FIG. 4A INPUT

FIG. 4D OUTPUT

FIG. 5

FIG. 6A INPUT

FIG. 6B CONTROL

FIG. 6C OUTPUT

FIG. 7

FIG. 8A INPUT

FIG. 8B CONTROL

FIG. 8C OUTPUT

FIG. 9

FIG. 10A INPUT

FIG. 10B CONTROL

FIG. 10C OUTPUT

FIG. 14A INPUT

FIG. 14B CONTROL 1

FIG. 14C CONTROL 2

FIG. 14D OUTPUT

MULTI-LEVEL SIGNAL GENERATING CIRCUIT

The present invention relates to a multi-level signal generating circuit which selectively provides signals with a plurality of levels in response to a single input signal.

Figure 1:
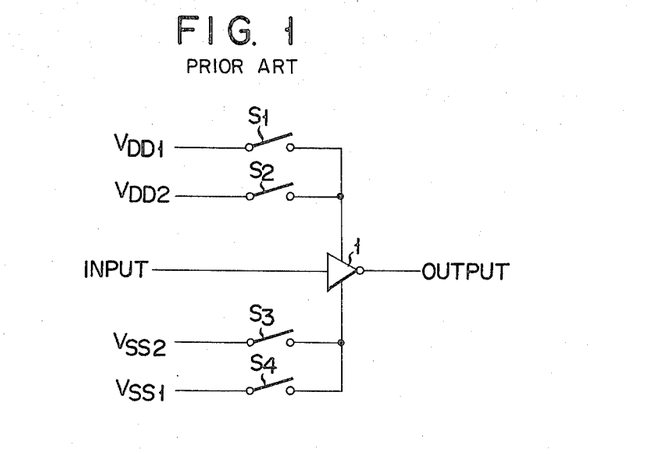
FIG. 1 is a schematic circuit diagram of a conventional multi-level signal generating circuit.
Figure 2A:
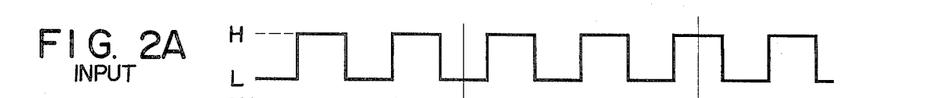
FIGS. 2A to 2D are a set of waveforms of assistance in explaining the operation of the signal generating circuit shown in FIG. 1.
Figure 2B:
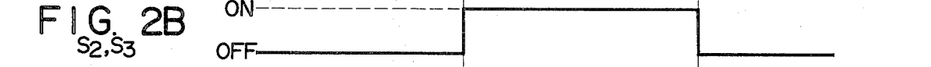
Figure 2C:
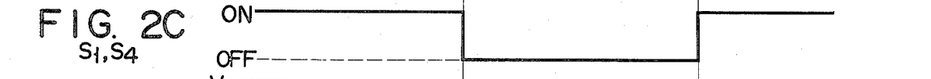
Figure 2D:
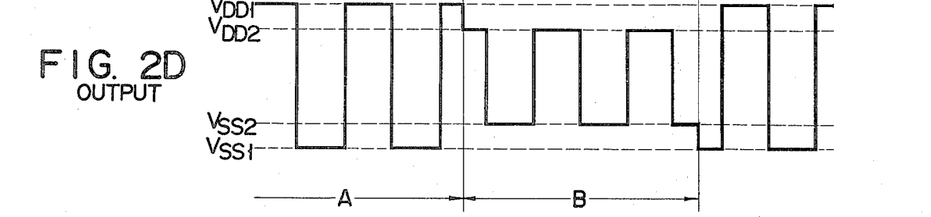

A multi-level signal generating circuit has been used as a driver circuit in a load circuit such as a level converter or a charge coupled device (CCD). A typical example of the multi-level signal generating circuit is as illustrated in FIG. 1. In the circuit shown in FIG. 1, when switches $S_1$ to $S_4$ are selectively switched, a signal with a corresponding level associated with the switches actuated is produced. In operation, when an input signal is inputted to an inverter 1, as shown in FIG. 2A, when the switches $S_1$ and $S_4$ are turned on to apply the voltages $V_{DD1}$ and $V_{SS1}$ to the inverter 1, as shown in FIG. 2C, the inverter provides an output signal over a period A in FIG. 2D which is the one level-inverted of the input pulse signal in FIG. 2A. A high level of the output signal corresponds to $V_{DD1}$ while a low level to $V_{SS1}$. Then, the switches $S_2$ and $S_3$ are turned on to apply voltages $V_{DD2}$ and $V_{SS2}$ to the inverter 1 (FIG. 2B). In response to the voltages, the inverter produces an output signal over a period B in FIG. 2D which is the level-inverted one of the input signal. A high level of the output signal corresponds to the voltage $V_{DD2}$, while a low level to the voltage $V_{SS2}$. Accordingly, when the voltage $V_{SS1}$ is lower than the voltage $V_{SS2}$ and the voltage $V_{DD1}$ is higher than the voltage $V_{DD2}$, a proper combination of the switches $S_1$ to $S_4$, when selectively actuated, provides an output signal with a corresponding level associated with the actuated switch combination. In this way, the inverter can provide output signals with a plurality of levels.

In such a circuit arrangement, the voltage applied to transistors contained in the inverter 1 changes when the switches $S_1$ to $S_4$ are actuated. Particularly where the inverter 1 is comprised of a complementary metal oxide semiconductor integrated circuit (CMOS IC), this possibly causes a latch-up phenomenon. In an extreme case, this leads to destruction of the circuit component. Furthermore, an IC chip including the switches $S_1$ to $S_4$ is different from an IC chip including the inverter 1. This gives rise to a problem of complicated construction.

Figure 3:
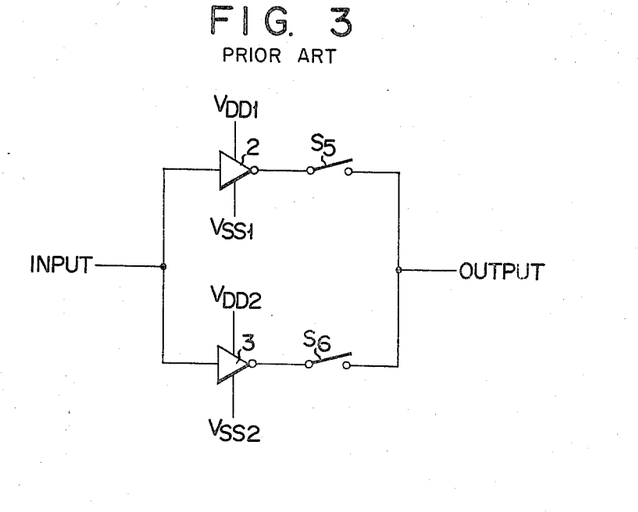
FIG. 3 is a schematic circuit diagram of another conventional multi-level signal generating circuit.
Figures 4A, 4B:
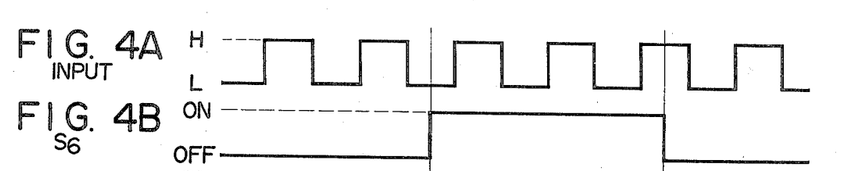
FIGS. 4A to 4D are a set of waveforms of assistance in explaining the operation of the signal generating circuit shown in FIG. 3.
Figures 4C, 4D:
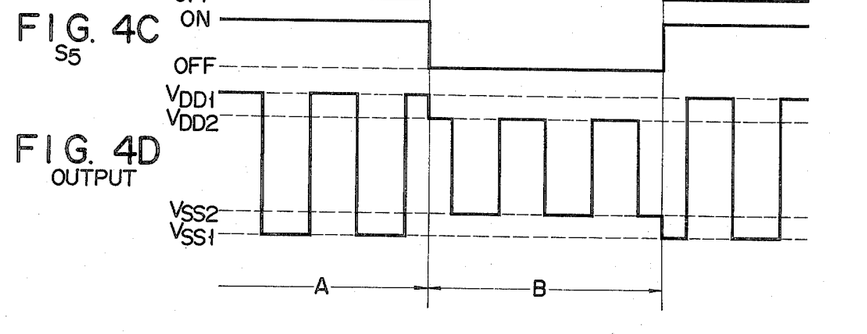

In addition to the multi-level signal generating circuit as mentioned above, there has been known another circuit as shown in FIG. 3. In operation, when an input signal as shown in FIG. 4A is applied to the multi-level signal generating circuit, the voltages $V_{DD1}$ and $V_{SS1}$ are applied to an inverter 2 in the circuit and the voltages $V_{DD2}$ and $V_{SS2}$ to an inverter 3. Under this condition, when the switch $S_5$ is turned on (FIG. 4C), the circuit produces an output signal over a period A in FIG. 4D which is the level-inverted one of the input signal in FIG. 4A. A high level of the output signal corresponds to the voltage $V_{DD1}$, while a low level to the voltage $V_{SS1}$. On the other hand, when the switch $S_6$ is turned on (FIG. 4B), the circuit produces an output signal over a period B in FIG. 4D. A high level of the output signal corresponds to the voltage $V_{DD2}$, while a low level of the output signal to the voltage $V_{SS2}$. Accordingly, when the high voltage pair $V_{DD1}$ and $V_{DD2}$ and the low voltage pair $V_{SS1}$ and $V_{SS2}$ are set to different levels, as shown in FIG. 4D, the output signals with different levels may be obtained by selectively switching the switches $S_5$ and $S_6$.

In the circuit arrangement of the present example, the switches $S_5$ and $S_6$ are inserted in the output side of the inverters 2 and 3, so that when the switches $S_5$ and $S_6$ are turned on, the resistive components thereof are inserted in the circuit. The insertion of the resistive components makes the rise and fall of the output signal blunt in waveshape. Additionally, an IC chip for the switches $S_5$ and $S_6$ is different from that for the inverters 2 and 3, thus making the construction of the device complicated.

Accordingly, an object of the present invention is to provide a multi-level signal generating circuit with a simple construction which is fabricated in a single chip and is free from the destruction of the elements and blunting the waveform of the output signal at the rise and fall thereof.

According to the present invention, there is provided a multi-level signal generating circuit which comprises: a first CMOS inverter for inverting an input signal to produce a first output signal having high and low voltage levels; a second CMOS inverter for inverting the input signal to produce a second output signal having high and low voltage levels; at least one of the high and low voltage levels of the second output signals being different from said high and low voltage of said first output signal; and switching circuit means operative to drive selectively said first CMOS inverter or said second CMOS inverter in response to a level of a control signal.

The present invention will better be understood when carefully reading the following description in connection with the accompanying drawings, in which.

Figure 5:
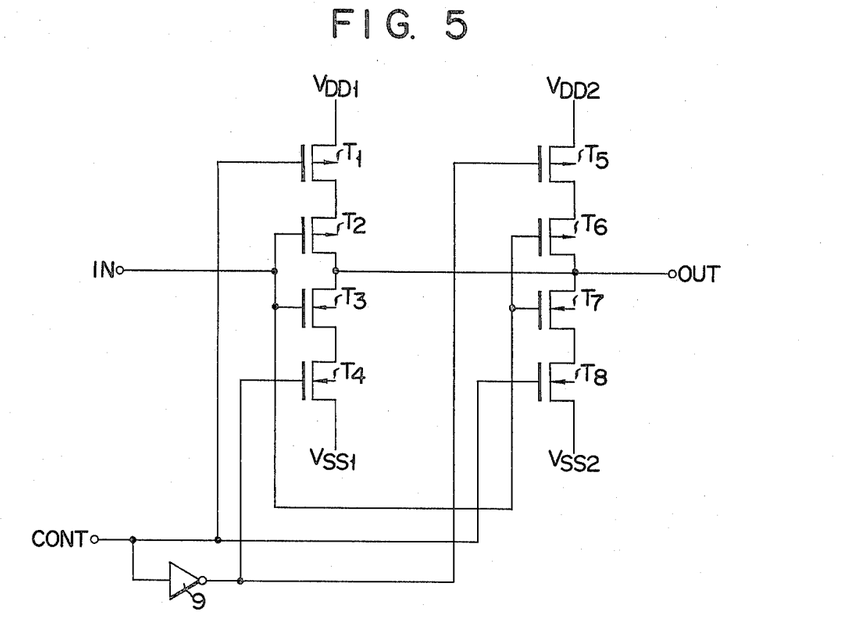
FIG. 5 is a circuit diagram of a multi-level signal generating circuit which is an embodiment according to the present invention.

Referring to FIG. 5, there is shown an embodiment of a multi-level signal generating circuit according to the present invention. In the figure, $T_1$, $T_2$, $T_5$ and $T_6$ designate P-channel MOS transistors, respectively, while $T_3$, $T_4$, $T_7$ and $T_8$ designate N-channel MOS transistors, respectively. A pair of the transistors $T_2$ and $T_3$ cooperate to form a CMOS inverter. Another pair of the transistors $T_6$ and $T_7$ also form a CMOS inverter. The transistors $T_1$, $T_4$, $T_5$ and $T_8$ operate as switching transistors to serve as switch elements.

A high level voltage $V_{DD1}$ is applied to the source of the transistor $T_1$. The drain of the transistor $T_1$ is connected to the source of the transistor $T_2$. The drain of the transistor $T_2$ is connected to the drain of the transistor $T_3$. The transistors $T_2$ and $T_3$, forming the CMOS inverter, are commonly connected at the gates thereof. The source of the transistor $T_3$ is connected to the drain of the transistor $T_4$. The source of the transistor $T_4$ is supplied with a low level voltage $V_{SS1}$.

The junction between the gates of the transistors $T_2$ and $T_3$ is connected to an input terminal IN of the multi-level signal generator circuit. An input pulse signal is applied to the input terminal of the multi-level signal generating circuit. The junction between the drain of the transistor $T_2$ and the drain of the transistor $T_3$ is connected to the output terminal OUT of the signal generating circuit.

The circuit construction relating to the transistors $T_5$ to $T_8$ is similar to that relating to the transistors $T_1$ to $T_4$, as mentioned above. A high level voltage $V_{DD2}$ is applied to the source of the transistor $T_5$. The drain of the transistor $T_5$ is connected to the source of the transistor $T_6$. The transistors $T_6$ and $T_7$, forming a CMOS inverter, are commonly connected at the gates. The junction between them is connected to the input terminal IN of the signal generating circuit. The transistors $T_6$ and $T_7$ are interconnected at the drains and connected at the junction to the output terminal OUT.

The source of the transistor $T_7$ is connected to the drain of the transistor $T_8$. The source of the transistor $T_8$ is supplied with a low level voltage $V_{SS2}$. The gates of the transistors $T_1$ and $T_8$ are directly connected to a control terminal CONT of the multi-level signal generating circuit. The gates of the transistors $T_4$ and $T_5$ are connected through an inverter 9 to the control terminal CONT. An input signal as shown in FIG. 6B is applied to the control terminal CONT. The voltage $V_{DD1}$ is higher than the voltage $V_{DD2}$. The voltage $V_{SS1}$ is lower than the voltage $V_{SS2}$.

The operation of the multi-level signal generating circuit thus constructed will be described referring to FIGS. 6A to 6C.

Assume that the voltages $V_{DD1}$, $V_{SS1}$, $V_{DD2}$ and $V_{SS2}$ are applied to the signal generating circuit. Under this condition, if the control signal (FIG. 6B) is at low level, (over a period A in FIG. 6C), the transistors $T_1$ and $T_4$ are turned on while the transistors $T_5$ and $T_8$ are turned off. Turning off transistors $T_5$ and $T_8$ causes the CMOS inverter including the transistors $T_6$ and $T_7$ to lose its inverter function. When the transistors $T_1$ and $T_4$ are in ON state, the voltage $V_{DD1}$ is applied to the source of the transistor $T_2$ and the voltage $V_{SS1}$ to the source of the transistor $T_3$. Under this condition, when the input pulse signal as shown in FIG. 6A is applied to the input terminal IN, i.e. the gates of the transistors $T_2$ and $T_3$ forming the inverter, a level-inverted signal as an output signal appears at the junction between the drains of both the transistors $T_2$ and $T_3$, that is, at the output terminal OUT of the multi-level signal generating circuit. The level-inverted circuit, shown in FIG. 6C, continues for a period A. A high level of the output signal corresponds to the voltage $V_{DD1}$ and the low level to the voltage $V_{SS1}$.

When the control signal becomes high in level, which continues for a period B in FIG. 6B, the transistors $T_1$ and the transistors $T_4$ are OFF. When the transistors $T_1$ and $T_4$ are OFF, the CMOS inverter by the transistors $T_2$ and $T_3$ loses its inverting function. When the transistors $T_5$ and $T_8$ are ON, the high voltage $V_{DD2}$ is applied to the source of the transistor $T_6$, while the low voltage $V_{SS2}$ is applied to the source of the transistor $T_7$.

Figure 6A:
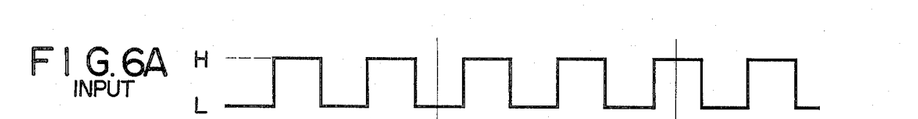
FIGS. 6A to 6C show timing charts useful in explaining the operation of the circuit shown in FIG. 5.
Figure 6B:
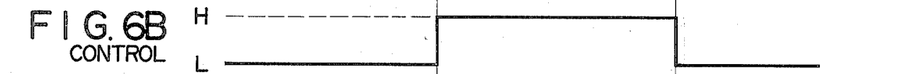

Under this condition, when the input pulse signal as shown in FIG. 6A is applied to the input terminal IN, that is, the gate of both transistors $T_6$ and $T_7$, the level-inverted input signal as an output signal is outputted from the junction between the drains of the transistors $T_6$ and $T_7$, i.e. the output terminal OUT. A high level of the output signal corresponds to the high voltage $V_{DD2}$, while a low level to the low voltage $V_{SS2}$.

Figure 6C:
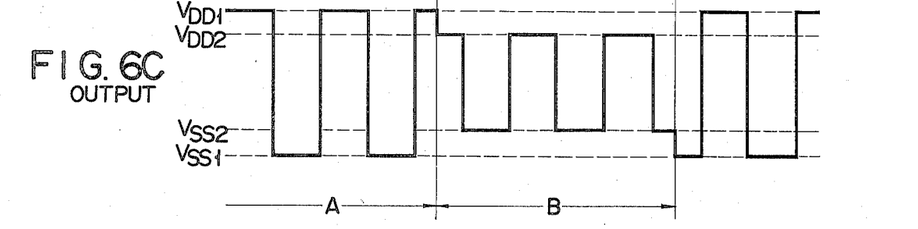

Through the above-mentioned operation of the multi-level signal generating circuit shown in FIG. 5, when the level of the control signal is inverted, the signal generating circuit produces the output signal with different levels as shown in FIG. 6C, that is, the multi-level signal. Additionally, since the switching operation in another chip is not needed, there is prevented occurrence of the latch-up phenomenon and hence the destruction of the circuit elements. Further, since the resistive component is not connected to the output side of the signal generating circuit, the waveshape at the rise and fall of the output signal is not distorted. The overall system including the switching elements may be fabricated in a single chip, resulting in simple construction and improvement of the reliability.

Figure 7:
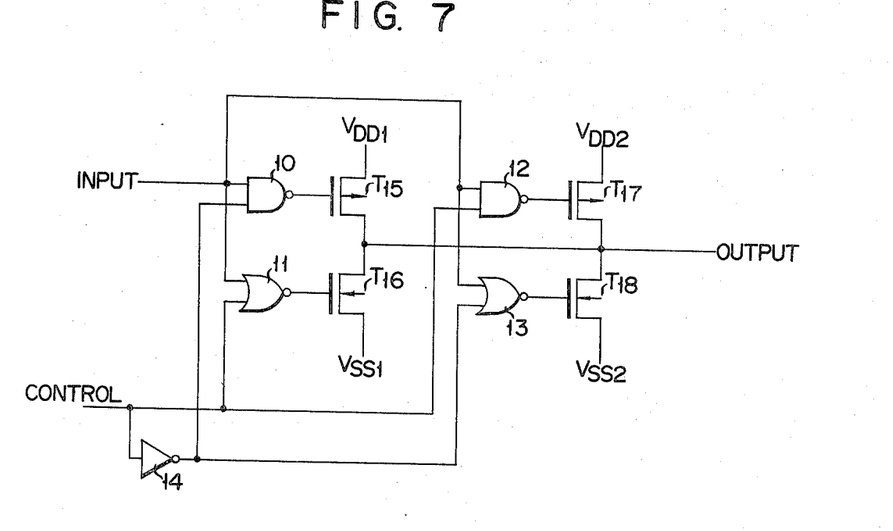
FIG. 7 is a circuit diagram of another embodiment of a multi-level signal generating circuit according to the invention.

Turning to FIG. 7, there is shown another embodiment of a multi-level signal generating circuit according to the invention. In FIG. 7, MOS transistors $T_{15}$ and $T_{17}$ are of P-channel type and MOS transistors $T_{16}$ and $T_{18}$ are of N-channel type. The transistors $T_{15}$ and $T_{16}$ form a CMOS inverter. The transistors $T_{17}$ and $T_{18}$ form a CMOS inverter.

The high level voltage $V_{DD1}$ is applied to the source of the transistor $T_{15}$. The transistors $T_{15}$ and $T_{16}$ are interconnected with each other at the drains. The low level voltage $V_{SS1}$ is applied to the source of the transistor $T_{16}$. The high level voltage $V_{DD2}$ is applied to the source of the transistor $T_{17}$. The drain of the transistor $T_{17}$ is connected to the drain of the transistor $T_{18}$. The low level voltage $V_{SS2}$ is applied to the source of the transistor $T_{18}$. The junctions between the pair of the drains of the transistors $T_{15}$ and $T_{16}$ and the pair of the drains of the transistors $T_{17}$ and $T_{18}$ are connected with each other. The output signal of the multi-level signal generating circuit is taken out from the junction.

An input signal is applied to the first input terminal of a two inputs type NAND gate 10, the first input terminal of a two inputs type NOR gate 11, the first input terminal of a two inputs type NAND gate 12, and the first input terminal of a two inputs type NOR gate 13. A control signal is directly applied to the second input terminal of the NOR gate 11 and the second input terminal of the NAND gate 12. The control signal is applied through an inverter 14 to the second input terminal of the NAND gate 10 and the second input terminal of the NOR gate 13. That is, the level-inverted control signal is applied to the second input terminal of the NAND gate 10 and the second input terminal of the NOR gate 13. The output terminal of the NAND gate 10 is connected to the gate of the transistor $T_{15}$. The output terminal of the NOR gate 11 is connected to the gate of the transistor $T_{16}$. The output terminal of the NAND gate 12 is connected to the gate of the transistor $T_{17}$. The output terminal of the NOR gate 13 is coupled with the gate of the transistor $T_{18}$.

Figure 8A:
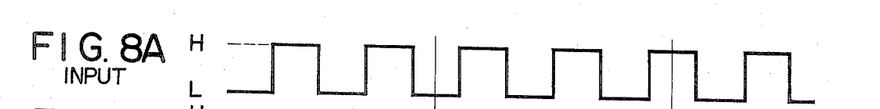
FIGS. 8A to 8C are timing charts useful in explaining the operation of the circuit shown in FIG. 7.

The operation of the multi-level signal generating circuit will be described referring to FIGS. 8A to 8C. FIG. 8A designates an input pulse signal, FIG. 8B a control signal, and FIG. 8C an output signal.

When the control signal is at low level (extending over a time interval A in FIG. 8B), the output signal of the NAND gate 12 is a high level and the transistor $T_{17}$ is OFF. The output signal of the NOR gate 13 is at low level and the transistor $T_{18}$ is OFF. Therefore, the CMOS inverter by the transistors $T_{17}$ and $T_{18}$ does not operate.

In this case, the NAND gate 10 operates to invert the level of the input voltage signal. The NOR gate 11 also functions to invert the level of the input voltage signal. The output signal from the NAND gate 10 is inputted to the gate of the transistor $T_{15}$. Further, the output signal of the NOR gate 11 is inputted to the transistor $T_{16}$, so that the CMOS inverter by the transistors $T_{15}$ and $T_{16}$ operates as an inverter and produces an output signal ranging over a time period A in FIG. 8C. A high level of the output signal is equal to the level of the $V_{DD1}$, while a low level of the output signal equal to that of $V_{SS1}$.

Figure 8B:
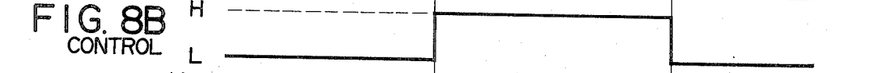

During a period B in FIG. 8B where the control signal is at high level, the output level of the NAND gate 10 is high and the output level of the NOR gate 11 is low, so that the transistors $T_{15}$ and $T_{16}$ are both OFF. At this time, the NAND gate 12 produces the inverted input signal (FIG. 8A) toward the gate of the transistor $T_{17}$. The NOR gate 13 also applies the inverted input signal to the gate of the transistor $T_{18}$. As a result, the CMOS inverter constructed by the transistors $T_{17}$ and $T_{18}$ performs its inverter function to produce an output signal over the interval B in FIG. 8C. The high level of the output signal is equal to that of the high level voltage $V_{DD2}$, while the low level of the output signal to the low level voltage $V_{SS2}$.

Figure 8C:
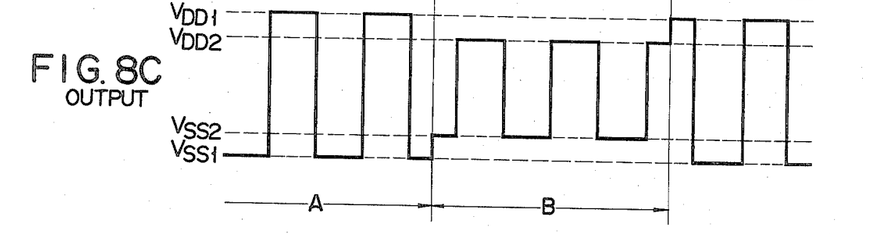

As shown in FIG. 8C, the multi-level signal generating circuit shown in FIG. 7 produces multi-level signals in this way.

Figure 9:
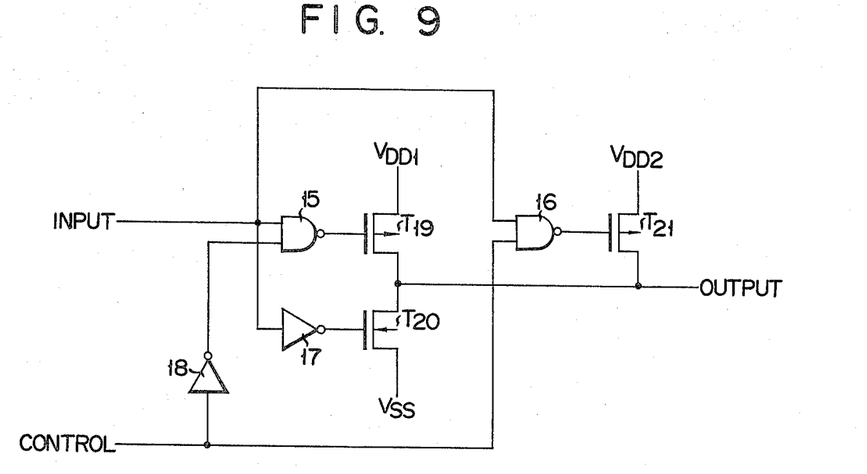
FIG. 9 is a circuit diagram of yet another embodiment of a multi-level signal generating circuit according to the present invention.

FIG. 9 shows yet another embodiment of a multi-level signal generating circuit according to the present invention. The present embodiment is so designed that the low level is set to a single level of the low level voltage $V_{SS}$ and only the high level is selectively switched. Of those three transistors $T_{19}$, $T_{20}$ and $T_{21}$, the transistors $T_{19}$ and $T_{21}$ are of the P-channel type and the transistor $T_{20}$ is of the N-channel type.

The high level voltage $V_{DD1}$ is applied to the source of a transistor $T_{19}$. The drain of the transistor $T_{19}$ is connected to the drain of a transistor $T_{20}$. The source of the transistor $T_{20}$ is supplied with the low level voltage $V_{SS}$. The output signal is taken out from the junction between the drains of the $T_{19}$ and $T_{20}$ and the drain of the transistor $T_{21}$. The source of the transistor $T_{21}$ is supplied with the high level voltage $V_{DD2}$.

An input signal is applied to the first input terminal of a two inputs type NAND gate 15 and the first input terminal of a NAND gate 16 of the two inputs type. The input pulse signal is also applied to the gate of a transistor $T_{20}$ via an inverter 17. The control signal is directly applied to the second input terminal of the NAND gate 16 and is applied to the second input terminal of the NAND gate 15 through the inverter 18. The output terminal of the NAND gate 15 is connected to the gate of a transistor $T_{19}$ and the output terminal of the NAND gate 16 is connected to the gate of a transistor $T_{21}$.

Figure 10A:
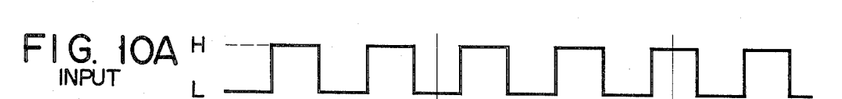
FIGS. 10A to 10C are timing charts for diagrammatically illustrating the operation of the circuit shown in FIG. 9.
Figure 10B:
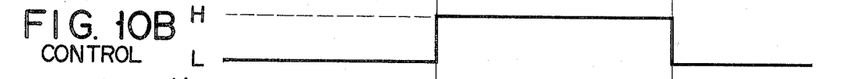
Figure 10C:
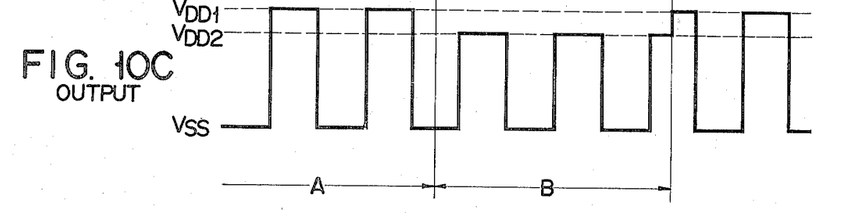

The operation of the multi-level signal generating circuit as mentioned above will be described referring to FIGS. 10A to 10C. When the control signal is at low level (see an interval A shown in FIG. 10B), the output signal of the NAND gate 16 is at high level and therefore the transistor $T_{21}$ is OFF. At this time, if the input pulse signal (FIG. 10A) is at high level, the transistor $T_{19}$ is ON. When the input pulse signal is at low level, the output signal of the inverter 17 becomes high in level to turn ON the transistor $T_{20}$. When the control signal is at low level, the CMOS inverter comprised of the transistors $T_{19}$ and $T_{20}$ performs the inverter operation to produce the signal during the period A in FIG. 10C. The high level of the output signal is equal to the level of the high level voltage $V_{DD1}$ and the low level to that of the low level voltage $V_{SS}$.

On the other hand, when the control signal is at high level (see a period B in FIG. 10B), the output signal from the NAND gate 15 becomes high in level to turn transistor $T_{19}$ OFF. Under this condition, if the input pulse signal is at high level, the output signal from the NAND gate 16 becomes low in level to turn the transistor $T_{21}$ ON. At an instant that the input pulse rises to high level, the output signal of the NAND gate 16 also rises to high level and the transistor $T_{21}$ becomes OFF. When the input pulse signal is at high level, the transistor $T_{20}$ is OFF. When the input pulse signal is at low level, the transistor $T_{20}$ is ON. Accordingly, when the control signal is at high level, the transistors $T_{20}$ and $T_{21}$ function as the CMOS inverter to produce the output signal extending over the period B in FIG. 10C. The high level of the output signal corresponds to the level of the high level voltage $V_{DD2}$, while the low level to the level of the low level voltage $V_{SS}$. In this way, the multi-level output signal is formed.

Figure 11:
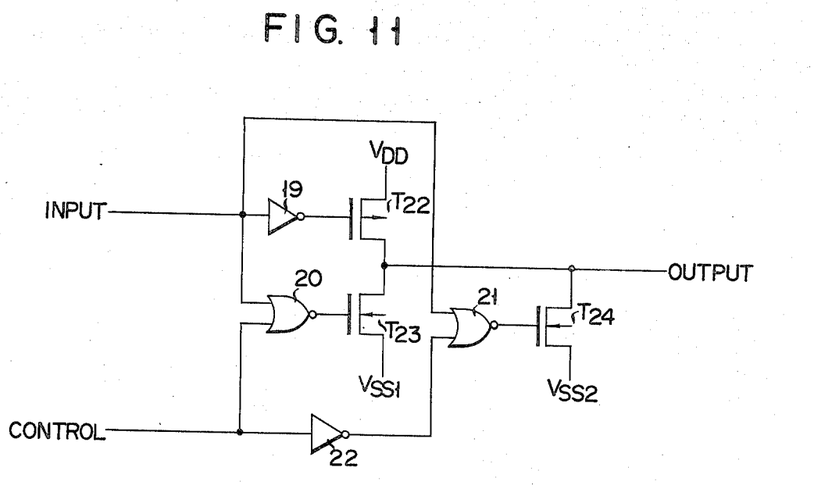
FIG. 11 shows a circuit diagram of still another embodiment of a multi-level signal generating circuit according to the present invention.

FIG. 11 shows additional embodiment of the multi-level signal generating circuit according to the present invention. The present embodiment, substantially based on the concept of FIG. 9 embodiment, is featured in that the high level of the multi-level signal is set to only the high level of the voltage $V_{DD}$ and the low level is set to either the $V_{SS1}$ or $V_{SS2}$. In the present embodiment, a MOS transistor $T_{22}$ is of P-channel type and MOS transistors $T_{23}$ and $T_{24}$ are of N-channel type. The source of the transistor $T_{22}$ is supplied with the high level voltage $V_{DD}$. The drain of the transistor $T_{22}$ is connected to the drain of the transistor $T_{23}$. The output signal is taken out from the junction between the drains of the transistors $T_{22}$ and $T_{23}$ and the drain of the transistor $T_{24}$. A low level voltage $V_{SS1}$ is applied to the source of the transistor $T_{23}$ and the low level voltage $V_{SS2}$ is applied to the source of the transistor $T_{24}$.

The input pulse signal is applied through an inverter 19 to the gate of the transistor $T_{22}$. The input pulse signal is applied to the first input terminal of the NOR gate 20 of the two inputs type, and the first input terminal of a NOR gate 21 of the two inputs type. The control signal is supplied to the second input terminal of the NOR gate 20 and to the second input terminal of the NOR gate 21, through the inverter 22. The output terminal of the NOR gate 20 is connected to the gate of the transistor $T_{23}$ and the output terminal of the NOR gate 21 is connected to the gate of the transistor $T_{24}$.

Figure 12A:
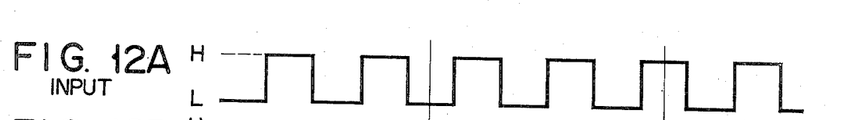
FIGS. 12A to 12C are waveforms at the respective portions when the circuit shown in FIG. 11 operates.

The operation of the above-mentioned embodiment will be described referring to FIGS. 12A to 12C.

Figures 12B, 12C:
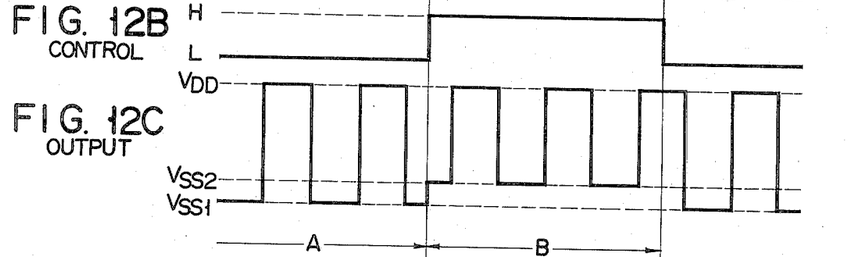

When the control signal shown in FIG. 12B is at low level (see a period A), the output signal from the NOR gate 21 is at low level and the transistor $T_{24}$ is OFF. When the control signal is at low level, the output signal of the NOR gate 20 is at low level if the input pulse signal (FIG. 12A) is at high level. In this case, the transistor $T_{23}$ is OFF. On the other hand, when the input pulse signal is at low level, the output signal from the NOR gate 20 is high in level to turn ON the transistor $T_{23}$. The transistor $T_{22}$ is ON when the input signal is high in level, and OFF when it is low.

Accordingly, when the control signal is at low level, the transistors $T_{22}$ and $T_{23}$ constitute a CMOS inverter to produce an output signal during a period A in FIG. 12C. The high level of the output signal corresponds to the level of the high level voltage $V_{DD}$ while the low level to the low level voltage $V_{SS1}$.

When the control signal is high in level (during the interval B in FIG. 12B), the output signal from the NOR gate 20 becomes low in level to turn off the transistor $T_{23}$. The transistor $T_{22}$ is ON when the input pulse signal is high in level; and the same is OFF when it is low. The transistor $T_{24}$ is ON when the input pulse signal is low in level and the output signal of the NOR gate 21 is high. When the input pulse signal is high, the output signal of the NOR gate 21 is low in level to turn OFF the transistor $T_{24}$.

Accordingly, when the control signal is high, the transistors $T_{22}$ and $T_{24}$ cooperate to form the CMOS inverter to produce an output signal extending over the interval B in FIG. 12C. The high level of the output signal corresponds to the level of the high level voltage $V_{DD}$, while the low level to that of the low level voltage $V_{SS2}$. In this way, the multi-level signal is produced.

Figure 13:
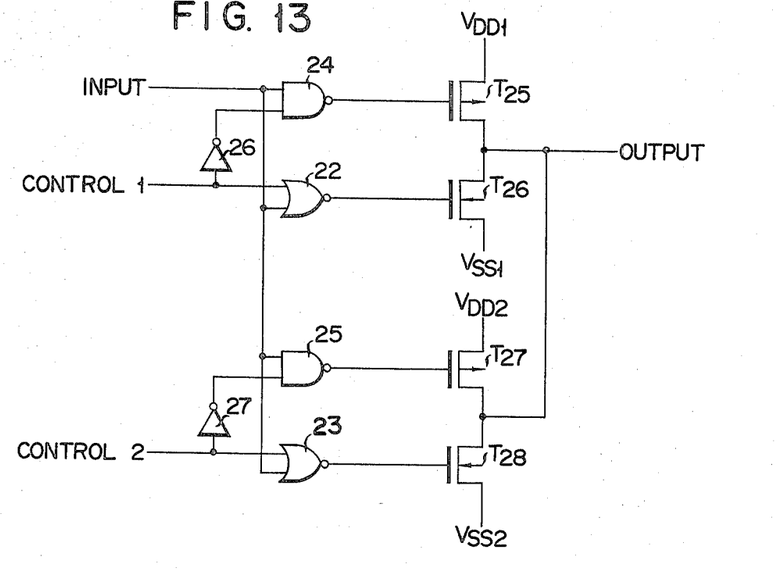
FIG. 13 shows a circuit diagram of a further embodiment of a multi-level signal generating circuit according to the present invention.

A further embodiment of a multi-level signal generating circuit will be described referring to FIG. 13. A feature of the present embodiment resides in that two control signals, instead of one control signal as in the above-mentioned embodiments, are used for the circuit control. In the embodiment shown in FIG. 13, transistors $T_{25}$ and $T_{27}$ are of P-channel type and transistors $T_{26}$ and $T_{28}$ are of N-channel type. The transistors $T_{25}$ and $T_{26}$ constitute a MOS inverter and the transistors $T_{27}$ and $T_{28}$ form a MOS inverter. The high level voltage $V_{DD1}$ is applied to the source of the transistor $T_{25}$. The drain of the transistor $T_{25}$ and the drain of the transistor $T_{26}$ are interconnected. The junction between them provides an output signal. The low level voltage $V_{SS1}$ is applied to the source of transistor $T_{26}$.

Similarly, the source of the transistor $T_{27}$ is supplied with the high level voltage $V_{DD2}$. The drains of the transistors $T_{27}$ and $T_{28}$ are interconnected to provide an output signal at the junction therebetween. That is, the junction between the pair of transistors $T_{25}$ and $T_{26}$ and the junction between the pair of the transistors $T_{27}$ and $T_{28}$ are commonly connected to each other. The source of the transistor $T_{28}$ is supplied with the low level voltage $V_{SS2}$.

A first control signal is applied to the first input terminal of a NOR gate 22. An input pulse signal is applied to the second input terminal of the NOR gate 22. The output terminal of the NOR gate 22 is coupled with the gate of the transistor $T_{26}$.

The second control signal is inputted to the first input terminal of a NOR gate 23 of which the second input terminal receives the input pulse signal. The output terminal of the NOR gate 23 is connected to the gate of the transistor $T_{28}$.

Reference numerals 24 and 25 designate NAND gates each with two inputs, respectively.

The first input terminal of a NAND gate 24 receives the input pulse signal and the second input terminal receives the first control signal applied through an inverter 26. The output terminal of the NAND gate 24 is connected to the gate of the transistor $T_{25}$. The input pulse signal is applied to the first input terminal of a NAND gate 25 and a second control signal is applied to the second input terminal thereof via an inverter 27. The output terminal of the NAND gate 25 is connected to the gate of the transistor $T_{27}$.

The operation of the multi-level signal generator thus constructed will be described referring to FIGS. 14A to 14D.

Figures 14A, 14B, 14C:
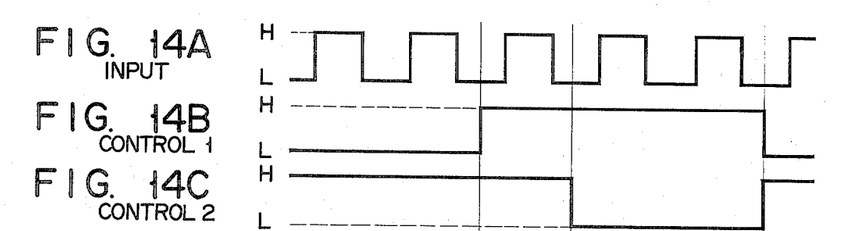
FIGS. 14A to 14D are waveforms at the respective portions when the circuit shown in FIG. 13 operates.

FIG. 14A shows an input pulse signal and FIGS. 14B and 14C show first and second control signals, respectively. FIG. 14C shows an output signal waveform.

When the first control signal is low in level, as shown during the period A in FIG. 14B, if the input pulse signal (FIG. 14A) is high, the output signal of the NAND gate 24 is low and the output signal from the NOR gate 22 also becomes low in level to turn ON the transistor $T_{25}$ and turn OFF the transistor $T_{26}$. Therefore, the high level voltage $V_{DD1}$ is outputted (see FIG. 14D). In this case, it is assumed that the second control signal is high in level, as shown in FIG. 14C. When the input pulse signal is at low level, the output signal of the NAND gate 24 becomes high and the output signal of the NOR gate 22 also becomes high. As a result, the transistor $T_{25}$ is turned OFF while the transistor $T_{26}$ is turned ON, with the result that an output signal of a level corresponding to the low level voltage $V_{SS1}$ is produced. Also in this case, the second control signal is at high level, as shown in FIG. 14C.

When the first control signal is high, the output signal from the NAND gate 24 becomes high regardless of the input pulse signal, to turn OFF the transistor $T_{25}$. The output signal from the NOR gate 22 becomes low in level to turn OFF the transistor $T_{26}$. The combination of the transistors $T_{25}$ and $T_{26}$, accordingly, loses its inverter function.

When the second control signal is low as shown during the period B shown in FIG. 14C, if the input pulse signal is high in level, the output signal from the NAND gate 25 is low in level to turn ON the transistor $T_{27}$. The output signal of the NOR gate 23 becomes low to turn OFF the transistor $T_{28}$.

Accordingly, when the second control signal is low (see the period of FIG. 14C), an output signal (FIG. 14D) is produced of which the high level is the high level voltage $V_{DD2}$, while the low level is the low level voltage $V_{SS2}$. In this case, it is assumed that the first control signal is high in level, as shown in FIG. 14B.

Through the operation as mentioned above, the multi-level signal is obtained.

Figure 14D:
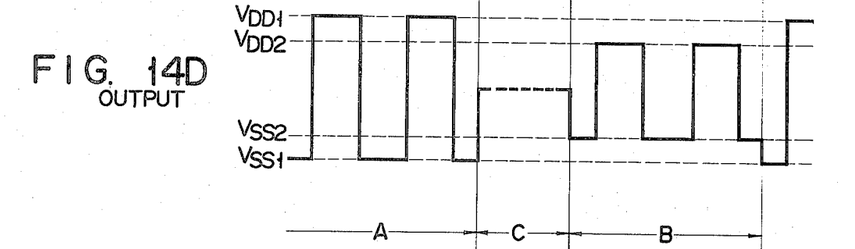

When the first and second control signals are both high in level, the level of the output signal is not fixed as indicated by the period C in FIG. 14D. The state of the output signal, when the first and second control signals are both at low in level, is not used in the embodiment.

It is evident that the effects obtained by the embodiments are substantially the same as those by the embodiment FIG. 5. That is, since the switching operation in another chip is not needed, there is prevented occurrence of the latch-up phenomenon and hence the destruction of the circuit elements. Further, since the resistive component is not connected to the output side of the signal generating circuit, the waveshape at the rise and fall of the output signal is never distorted. The overall system including the switching elements may be fabricated into a single chip, resulting in simple construction and improvement of the reliability.

What we claim is:

1. A multi-level signal generating circuit for changing, in response to a control pulse signal, the high and low levels of an input signal between voltage levels supplied by a first voltage source and voltage levels supplied by a second voltage source, said circuit comprising:

an input terminal coupled to said input signal;

a first voltage source terminal connected to a high voltage level of said first voltage source;

a second voltage source terminal connected to a low voltage level of said first voltage source;

a third voltage source terminal connected to a high voltage level of said second voltage source;

a fourth voltage source terminal connected to a low voltage level of said second voltage source;

a control terminal coupled to said control pulse signal;

a first CMOS circuit coupled to said input terminal, said control terminal and said first and second voltage source terminals, said first CMOS circuit producing, when enabled by said control pulse signal, a first output signal varying in response to said input signal between approximately said high and low voltage levels of said first voltage source, said first CMOS circuit comprising first and second MOS transistors complementary to each other and connected in series between said first and second voltage source terminals and first logic means connected between said input and control terminals and the gates of said first and second MOS transistors for supplying said input signal to said gates of said first and second transistors when said control pulse signal is in a first state thereby to enable said first CMOS circuit; and a second CMOS circuit coupled to said input terminal, said control terminal, and said third and fourth voltage source terminals, said second CMOS circuit producing, when enabled, a second output signal varying in response to said input signal between approximately said high and low voltage levels of said second voltage source, said second CMOS circuit comprising third and fourth MOS transistors complementary to each other and connected in series between said third and fourth voltage source terminals and second logic means connected between said input and control terminals and the gates of said third and fourth MOS transistors for supplying said input signal to the gates of said third and fourth transistors when said control pulse signal is in a second state thereby to enable said second CMOS circuit.

2. A multi-level signal generating circuit according to claim 1 further including an inverter connected to said control pulse signal wherein said control terminal includes a first terminal connected to said control pulse signal and a second terminal connected to said output of said inverter, wherein said first and second logic means each includes a NAND gate and a NOR gate each connected to said input terminal, said NAND gate in said first logic means and said NOR gate in said second logic means also being connected to said second control terminal and said NOR gate in said first logic means and said NAND gate and said second logic gates also being connected to said first control terminal.

* * * * *